United States Patent [19]
del Alamo et al.

[11] Patent Number: 5,105,232
[45] Date of Patent: Apr. 14, 1992

[54] QUANTUM FIELD-EFFECT DIRECTIONAL COUPLER

[75] Inventors: Jesûs A. del Alamo, Boston; Cristopher C. Eugster, Cambridge, both of Mass.

[73] Assignee: Massachusetts Institute of Technology, Cambridge, Mass.

[21] Appl. No.: 680,623

[22] Filed: Mar. 28, 1991

Related U.S. Application Data

[63] Continuation of Ser. No. 412,656, Sep. 26, 1989, abandoned.

[51] Int. Cl.$^5$ ............... H01L 29/161; H01L 29/208; H01L 29/80
[52] U.S. Cl. ....................................... 357/16; 357/22
[58] Field of Search ................. 357/16, 22 A, 24, 4; 350/96.11, 96.13, 96.14

[56] References Cited

U.S. PATENT DOCUMENTS

| | | | |
|---|---|---|---|
| 4,701,774 | 10/1987 | McIlroy et al. | 357/17 |
| 4,711,857 | 12/1987 | Cheng | 437/3 |
| 4,733,282 | 3/1988 | Chang et al. | 357/4 |
| 4,769,683 | 9/1988 | Goronkin et al. | 357/4 |
| 4,832,432 | 5/1989 | Erman | 350/96.14 |
| 4,835,578 | 5/1989 | Ohtoshi et al. | 357/4 |
| 4,877,299 | 10/1987 | Lorenzo et al. | 350/96.14 |
| 4,887,877 | 12/1989 | Inoue et al. | 350/96.11 |
| 4,904,037 | 2/1990 | Imato | 350/96.11 |
| 4,912,531 | 3/1990 | Reed et al. | 357/16 |

FOREIGN PATENT DOCUMENTS

WO89/07832 8/1989 European Pat. Off. .

OTHER PUBLICATIONS

"Toward Quantum Well Wires: Fabrication and Optical Properties", Petroff et al., *Appl. Phys. Lett.* 41 (7), Oct. 1, 1982, pp. 635–638.

"Quantum Wires in InGaAs/InP Fabricated by Holographic Photolithography", Miller et al., *Appl. Phys. Lett.* 54(2), Jan. 9, 1989, pp. 188–191.

"Gate-Controlled Transport in Narrow GaAs/Al$_x$Ga$_{1-x}$As Heterostructures", Zheng et al., *Physical Review B*, vol. 34, No. 8, pp. 5635–5638.

"Conductance Characteristics of Ballistic One-Dimensional Channels Controlled by a Gate Electrode", Hirayama et al., *Appl. Phys. Lett.* 54(25), Jun. 19, 1989, pp. 2556–2558.

"New Field-Effect Transistor with Quantum Wire and Modulation-Doped Heterostructures", Tsubaki et al., *Electronic Letters*, Sep. 29, 1988, vol. 24, No. 20, pp. 1267–1269.

"Fabrication Technique for GaInAsP/InP Quantum Wire Structure by LP-MOVPE", Daste et al., *Journal of Crystal Growth* 93 (1988), pp. 365–369.

"The Quantum Transistor", Reed, M., *Byte*, May 1989, pp. 275–281.

"One-Dimensional Conduction in the 2D Electron Gas of a GaAs-AlGaAs Heterojunction", Thornton et al., *Physical Review Letters*, vol. 56, No. 11, Mar. 17, 1986, pp. 1198–1201.

"Quantized Conductance of Point Contacts in a Two-Dimensional Electron Gas", van Wees et al., *Physical Review Letters*, vol. 60, No. 9, Feb. 29, 1988, pp. 848–850.

"Submicron Conducting Channels Defined by Shallow Mesa Etch in GaAs-AlGaAs Heterojunctions", van Houten et al., *Appl. Phys. Lett.* 49(26), Dec. 29, 1986, pp. 1781–1783.

(List continued on next page.)

*Primary Examiner*—Andrew J. James
*Assistant Examiner*—Ngan Van Ngo
*Attorney, Agent, or Firm*—Hamilton, Brook, Smith & Reynolds

[57] ABSTRACT

A quantum field-effect directional coupler is described comprised of two quantum waveguides closely spaced apart with an adjacent gate electrode over the space between waveguides. The coupling of electron probability density between waveguides is controlled by the voltage applied to the gate electrode. The coupler implements a voltage-controlled current switch. Several couplers can be connected to perform multiplex/demultiplexing functions.

16 Claims, 5 Drawing Sheets

OTHER PUBLICATIONS

"Quantum Transport in an Electron-Wave Guide", Timp et al., *Physical Review Letters*, vol. 59, No. 6, Aug. 10, 1987, pp. 732–735.

"Experimental Determination of the Edge Depletion Width of the Two-Dimensional Electron Gas in GaAs-/Al$_x$Ga$_{1-x}$As", Choi et al., Appl. Phys. Lett. 50(2), Jan. 12, 1987, pp. 110–112.

"One-Dimensional Subbands and Mobility Modulation in GaAs/AlGaAs Quantum Wires", Ismail et al., *Appl. Phys. Lett.* 54(12), Mar. 20, 1989, pp. 1130–1132.

"Phase Coherence Length of Electron Waves in Narrow AlGaAs/GaAs Quantum", Hiramoto et al., *Appl. Phys. Lett.* 54(21), May 22, 1989, pp. 2103–2105.

SOURCE WAVEGUIDE   DRAIN WAVEGUIDE

QUANTUM FIELD-EFFECT DIRECTIONAL COUPLER

This is a continuation of co-pending application Ser. No. 07/412,656 filed on Sept. 26, 1989 now abandoned.

BACKGROUND OF THE INVENTION

In recent years, there has been much interest in exploiting the wave nature of electrons to achieve interference effects in microelectronic structures. This intense effort has been s purred by the achievement of Molecular Beam Epitaxial (MBE) layered semiconductor structures with very high electron mobilities at low temperatures, such as modulation-doped III-V heterostructures and, in particular, AlGaAs/GaAs heterostructures. In this semiconductor system, in particular, it is possible to build an entire device with active dimensions confined smaller than the electron's phase coherence length, i.e., 1 to 5 $\mu$m, or less, depending on temperature, so that the phase of the electron wavefunction is preserved everywhere. Such a device is generally called a quantum structure. Under these circumstances, electron wave interference effects take place. In fact, electron wave interference in the AlGaAs/GaAs system has unequivocally been confirmed by the observation of the Aharanov-Bohm effect in very narrow rings and of coherent electron diffraction in periodic structures.

A quantum structure, such as a thin epitaxial film of narrow bandgap material, sandwiched between wider bandgap material, limits electrons to two degrees of freedom in the film and is referred to as a 2D Quantum Well or merely a Quantum Well. When the movement of electrons is further constricted in another direction, leaving only one degree of freedom, such as in a thin wire or waveguide, the structure is called a "Quantum Wire" or "Quantum Waveguide". One of the attributes of quantum wires or waveguides is the enhanced mobility of electrons in such structures caused by the reduction in scattering events resulting from one-dimensional confinement.

Goronkin et al., U.S. Pat. No. 4,769,683 issued Sept. 6, 1988, report the construction of a quasi 1-dimensional electron gas field-effect transistor in which 1-dimensional channel guide electrodes are arranged in parallel between source and drain electrodes for the purpose of reducing thermally generated noise.

Petroff et al. in "Toward Quantum Well Wires: Fabrication and Optical Properties", *Appl. Phys. Lett.* 41(7), October 1982, describe methods of fabricating quantum wires using molecular beam epitaxy (MBE) of GaAs and $Ga_{1-x}Al_xAs$.

Ohtoshi et al. in U.S. Pat. No. 4,835,578 and Tsubaki et al., in *Electronics Letters*, V. 24, No. 20, September 1988, describe LED and FET semiconductor structures, respectively, having quantum wires.

Miller et al. in "Quantum Wires in InGaAs/InP Fabricated by Holographic Photolithography", *Appl. Phys. Lett.* 54(2), Jan. 9, 1989, described holographic techniques for fabrication of quantum wires.

Zheng et al. in "Gate-Controlled Transport in Narrow GaAs/$Al_xGa_{1-x}As$ Heterostructures", *Physical Review*, Vol. 34, No. 8, October 1986 and Hirayama et al. in "Conductance Characteristics of Ballistic One-Dimensional Channels Controlled by a Gate Electrode", *Appl. Phys. Lett.* 54(25), June 19, 1989 have conducted experimental studies into the transport phenomena of quantum wires.

The above represents a small sampling of the research and development effort being expended in this relatively new area of quantum physics related to ultrasmall structures.

SUMMARY OF THE INVENTION

In the present invention, the coherent quantum mechanical tunneling between two closely spaced electron waveguides is controlled by a voltage applied to a gate electrode adjacent the waveguides. The energy barrier height between the two waveguides is controlled by the applied voltage; thereby controlling coherent electron tunneling between waveguides to produce a new device called a quantum field-effect directional coupler (QFED).

In the QFED, as an electron wave packet travels down one waveguide, electrons are transferred by quantum mechanical tunneling from one waveguide to another along an interaction length wherein the waveguides are closely spaced. Phase coherence must be preserved for synchronous coupling to occur. For a coupler to transfer any given fraction of the electrons from one waveguide to another, the waveguides are bent away from each other at a predetermined calculated point; and, as noted above, the degree of coupling can be controlled by a gate voltage.

The above and other features and advantages of the invention will now be described in detail in connection with the following drawings:

DETAILED DESCRIPTION OF THE INVENTION

Figure 1:
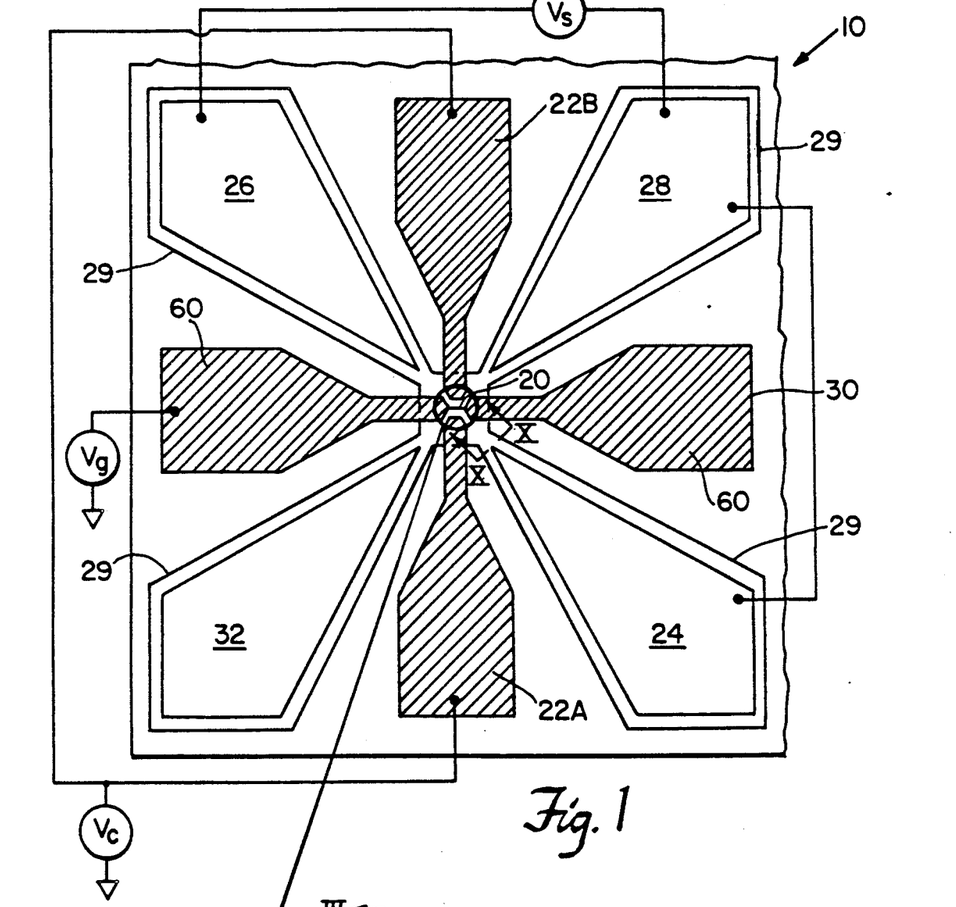
FIG. 1 is a top plan view of a QFED formed on a region of a chip in accordance with a preferred embodiment of the invention.
Figure 2:
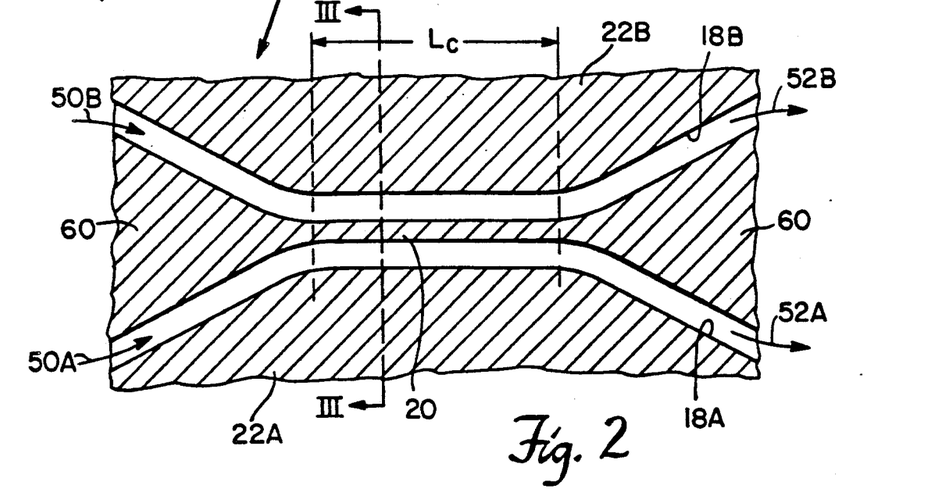
FIG. 2 is an enlarged view of the active portion of the QFED of FIG. 1.
Figure 3:
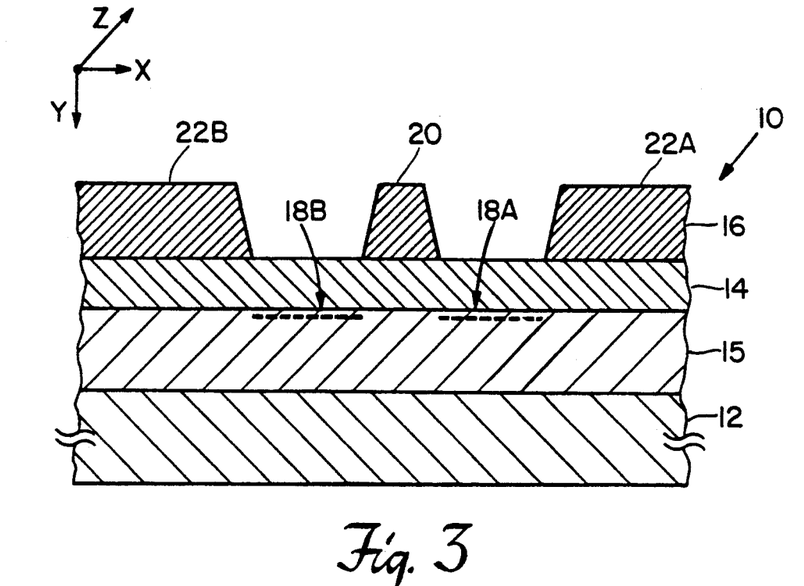
FIG. 3 is a cross-section of the enlarged portion of FIG. 2 taken along lines III—III.

Referring now to FIGS. 1-3, the details of the QFED 10 of a preferred embodiment of the invention will now be disclosed. The QFED consists of two electron waveguides 18A and 18B closely spaced over a critical interaction length $L_c$ (FIG. 2); so that electrons can be transferred from one waveguide to another by quantum mechanical tunneling. The waveguides bend away from each other, before and after the interaction length.

The waveguides 18A and 18B are formed on a suitable III-V semiconductor channel layer 15 (preferably of GaAs) over a substrate 12, such as GaAs, upon which a doped III-V layer 14 preferably of n+ AlGaAs is formed (FIG. 3).

The waveguides are formed by narrowly constricting the two-dimensional electron gas 40 of the AlGaAs/GaAs modulation-doped structure by providing a split gate structure consisting of gates 60 and configuring electrodes 22A and 22B. Formation of split-gate structures is described in Thornton et al., *Phys. Rev. Lett.* 56, 1198 (1986); van Wees, et al., *Phys. Rev. Lett.* 60, 848 (1988); and Zheng et al., *Phys. Rev. B* 34, 5635 (1986). Alternate methods of forming quantum waveguides are mesa etching [van Houten et al., *Appl. Phys. Lett.* 49, 1781 (1986); Timp et al., *Phys. Rev. Lett.* 59, 732 (1987); Choi et al., *Appl. Phys. Lett.* 50, 110 (1987); Ismail et al., *Appl. Phys. Lett.* 54, 1130 (1989)], and focused ion-beam damage introduction [Hiramoto et al., *Appl. Phys. Lett.* 54, 2103 (1989)]. The result for each case is a quantum wire 18A,18B in which electrons are confined in two dimensions (x and y in FIG. 3) but are free to move along the third one (z).

Figure 10:
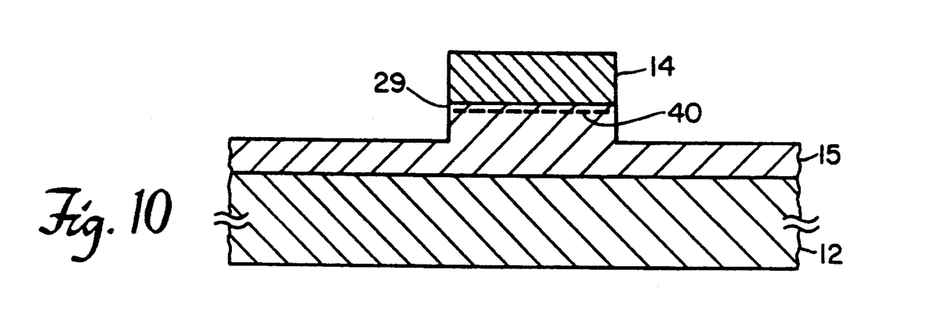
FIG. 10 is a partial cross-section of the enlarged portion of FIG. 2 taken along lines X—X.

Isolation from other devices (not shown) on the substrate 12 is achieved by etching layer 14 into layer 15 to form a mesa structure defined by line 29 (See FIG. 1 and FIG. 10).

Running between the waveguides and over the entire coupler critical length $L_c$ is a very narrow metal gate 20 formed, for example, of gold or tungsten. This gate, through an applied gate voltage, controls the energy barrier height between the two waveguides 18A and 18B. The strength of the electron coupling between the two waveguides is, therefore, modulated by the field-effect action of the gate 20. In order to maintain consistency with other electronic devices, the two waveguides are herein referred to as source waveguide 18B and drain waveguide 18A. The two ends 50 and 52 of each waveguide are referred to as input end 50B, 50A and output end 52B, 52A. Ohmic source and drain input contacts 26 and 32 are applied to the waveguides which act as large reservoirs for electrons. Also, ohmic source and drain output contacts 28 and 24, respectively, are applied to the waveguides; and ohmic contacts 60 are applied to the gate 20. Lastly, a confining potential $V_c$ is applied to electrodes 22A and 22B, which serve as containment electrodes for the waveguides.

To illustrate one mode of operation of the QFED 10, a small voltage $V_s$ is applied between the input and output contacts 26 and 28 of the source waveguide 18B. The output contact 24 of the drain waveguide 18A is shorted to the output contact 28 of the source waveguide 18B. The current from the two output waveguides 52A and 52B is monitored. If the coupler length $L_c$ is smaller than the electron phase coherence length, electrons at the Fermi energy at the input of the source waveguide 18B travel ballistically through the coupler, while their phase remains unperturbed.

Figure 4:
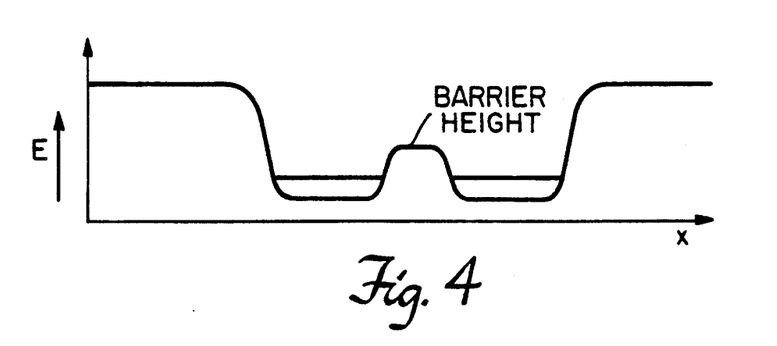
FIG. 4 is a plot of the electron energy E in the waveguides 18A and 18B versus the cross-sectional dimension (X-direction) of the waveguides.
Figure 5:
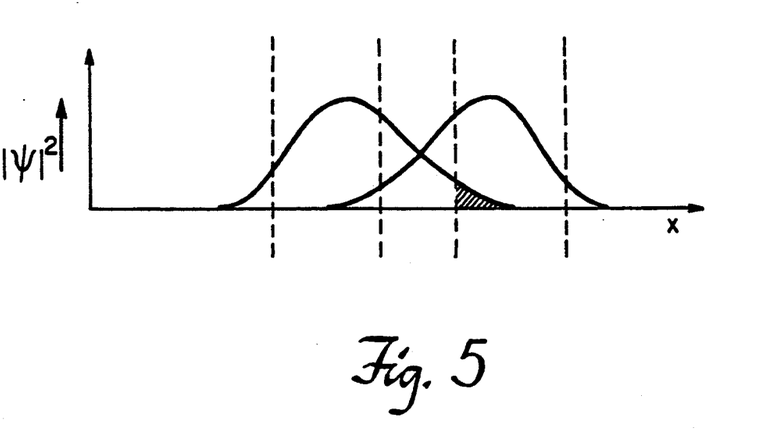
FIG. 5 is a plot of the electron probability density $|\psi|^2$ in space across the waveguides.
Figure 6:
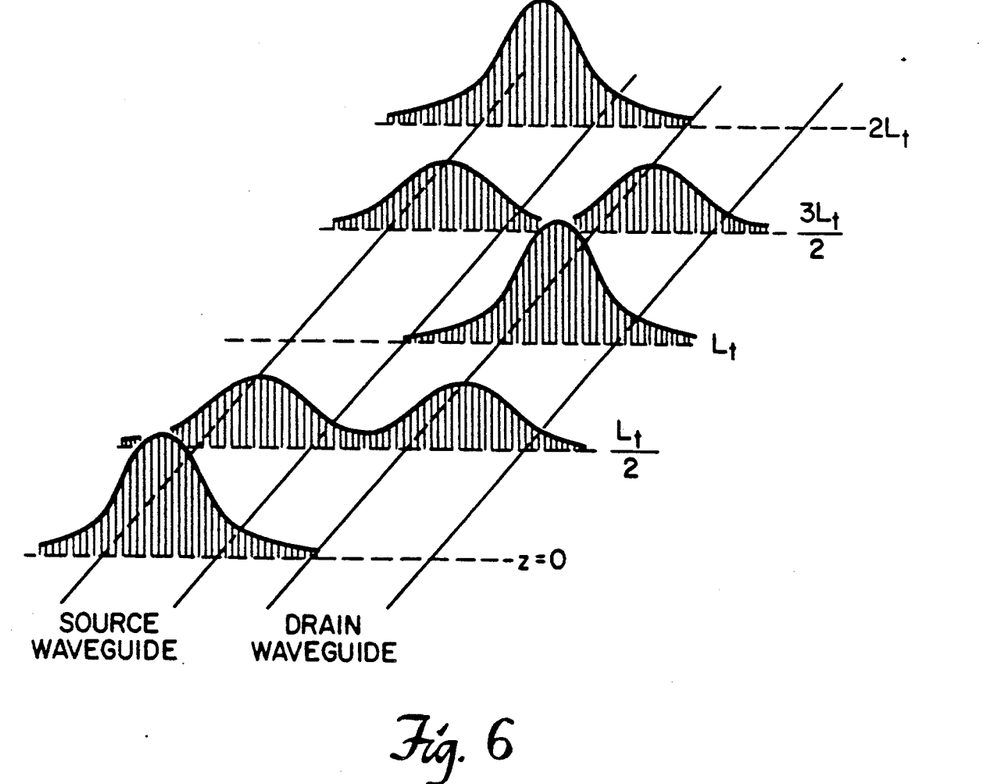
FIG. 6 is a schematic representation of the transfer along the Z-coordinate of electrons (electron probability density) from one waveguide to another along the length of the coupler.

If the energy barrier (FIG. 4) between the two waveguides is small enough in height and width, a significant portion of the tail of the electron wavefunction at the input of the source waveguide 18B penetrates into the drain waveguide 18A exciting propagation modes in it. Since the phase of the electron in the source waveguide is unique, the tunneling process occurs in phase throughout the coupler length, i.e., coherent tunneling takes place. As a result, the electron probability density (FIGS. 5 and 6) is transferred periodically between the waveguides as the electrons travel down the coupled region. This can also be understood by realizing that the coupled system will consist of a symmetric mode and an antisymmetric mode. The symmetric mode pumps the antisymmetric mode and vice versa. Exciting the input of the source waveguide selects a particular combination of these two modes which will transfer electron probability density back and forth between the source and drain waveguides as the packet travels down the coupler 10. In particular, at a certain length, $L_t$, the probability density starts being transferred back to the source waveguide. For a length exactly equal to $2L_t$, complete probability density is now back again at the source waveguide, and so on, in a periodic manner. This process is schematically illustrated in FIG. 6.

The transfer length, $L_t$, or length of the coupled region required for complete probability density transfer, from the source to the drain waveguide, is a function of the strength of the potential barrier existing between the two quantum waveguides. A higher or thicker barrier requires longer transfer lengths. In the QFED, this barrier is modulated by the field-effect action of the gate 20. For a given physical coupler length $L_c$, complete transfer or negligible transfer can be achieved by varying the applied voltage $V_g$. In this manner, the device behaves as a voltage-controlled current switch.

A first order model of the QFED uses weak coupled-mode theory developed for guided-wave optics. The electron wavefunction in an isolated waveguide is of the form:

$$\psi(x,y,z) = u(x)v(y)e^{-jk_z z} \qquad \text{Equation 1}$$

since the electrons are confined in x and y, but are free to move along z (FIG. 3). The confining potential in the x-direction is denoted as $V_x$ and $k_z$ represents the electron wave vector along the z axis.

If the two waveguides 18A and 18B are sufficiently close to each other, a significant overlap of the wave functions in the x direction will occur. This will affect propagation along the z direction. For this coupled case, wave functions in the two waveguides may take the form:

$$\psi_a(x,y,z) = u_a(x)v_a(y)a(z)e^{-jk_{az} z} \qquad \text{Equation 2}$$

$$\psi_b(x,y,z) = u_b(x)v_a(y)b(z)e^{-jk_{bz} z} \qquad \text{Equation 3}$$

where $u_a$, $v_a$, $u_b$, $v_b$ are the solutions of the uncoupled waveguides in the x and y directions. In the case of negligible coupling, a(z) and b(z) do not depend on z and will be independent of each other.

Coupled mode theory can be used to develop a system of equations for a(z) and b(z) analogous to guided-wave optics. This is obtained by substituting the wavefunction of the coupled-mode system $\psi_c = \psi_a + \psi_b$ into the time-independent Schrodinger equation utilizing the proper confining potential for the coupled system along the x-direction $V_{cx}$. For weak coupling, $V'_x = V_{cx} - V_x$ represents a small perturbation of the confining potential along the x-direction. For a completely symmetric system (identical dimensions for the waveguides) and under the normalized initial conditions at the input of the coupler a(0)=1, b(0)=0 (i.e., a condition in which the input to the source waveguide is excited) a(z) and b(z) become:

$$a(z) = \cos \kappa z \quad \text{Equation 4}$$

$$b(z) = -\sin \kappa z \quad \text{Equation 5}$$

where $\kappa$ is the coupling coefficient:

$$\kappa = \frac{m^*}{\hbar^2 k_z} \int_{-\infty}^{\infty} u_a^* V_x' u_b \, dx \quad \text{Equation 6}$$

The sinusoidal nature of equations 4 and 5 implies that for a certain coupler length $(2m+1)\pi/2\kappa$ with $m=0, 1, 2, \ldots$, the amplitude of the wavefunction in the source waveguide 18B becomes zero, while in the drain waveguide 18A it becomes unity. If the waveguides separate precisely at any of these lengths, then full transfer of electrons takes place to the drain waveguide at the output of the coupler. The transfer length $L_t$ is defined as the shortest of all these allowed lengths (m=0):

$$L_t = \frac{\pi}{2\kappa} \quad \text{Equation 7}$$

For ideal waveguides with finite square-well profiles in the x direction of thickness $W_x$, a barrier thickness $W_b$, and a barrier height $V_B$ in the x-direction separating the two waveguides, the coupling coefficient follows from equation 6, to become:

$$\kappa = \frac{m^*}{\hbar^2 k_z} \frac{\alpha V_B e^{-\alpha W_b}}{(\alpha^2 + k_x^2)\left(\frac{1}{\alpha} + \frac{W_x}{2}\right)} \quad \text{Equation 8}$$

where $k_x = \frac{1}{\hbar} \sqrt{2m^* E_x}$, with $E_x$ being the energy of the bound state in the x-direction, and $\alpha^2 = 2m^*(V_B - E_x)/\hbar^2$.

Figure 7:
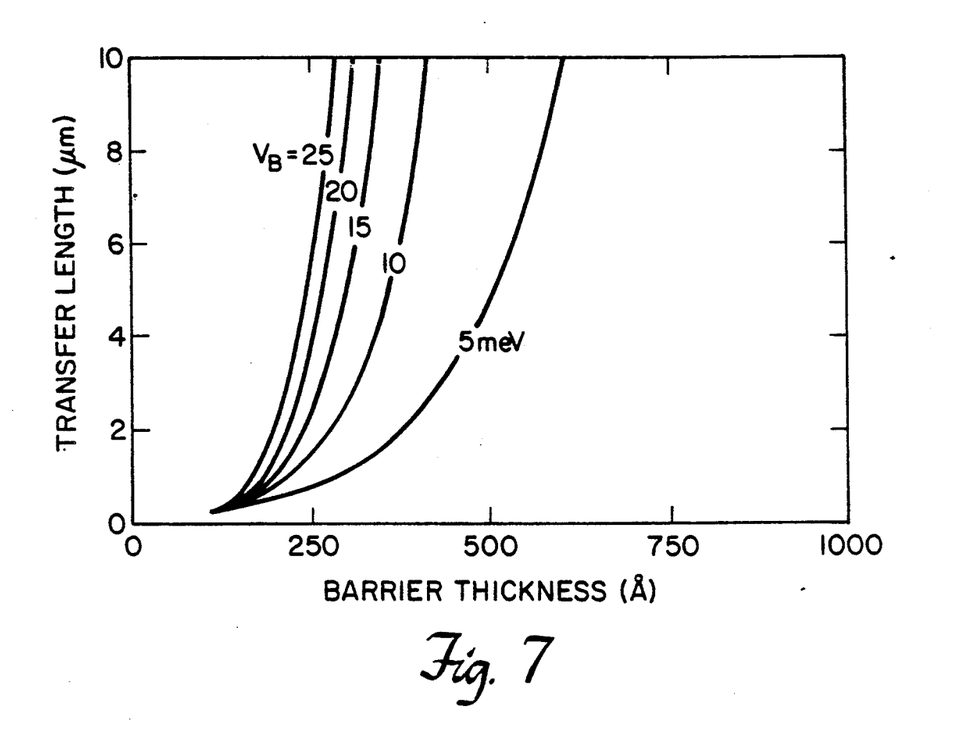
FIG. 7 is a plot of transfer length in micrometers versus barrier thickness in angstroms for different barrier heights $V_B$ in meV.
Figure 9:
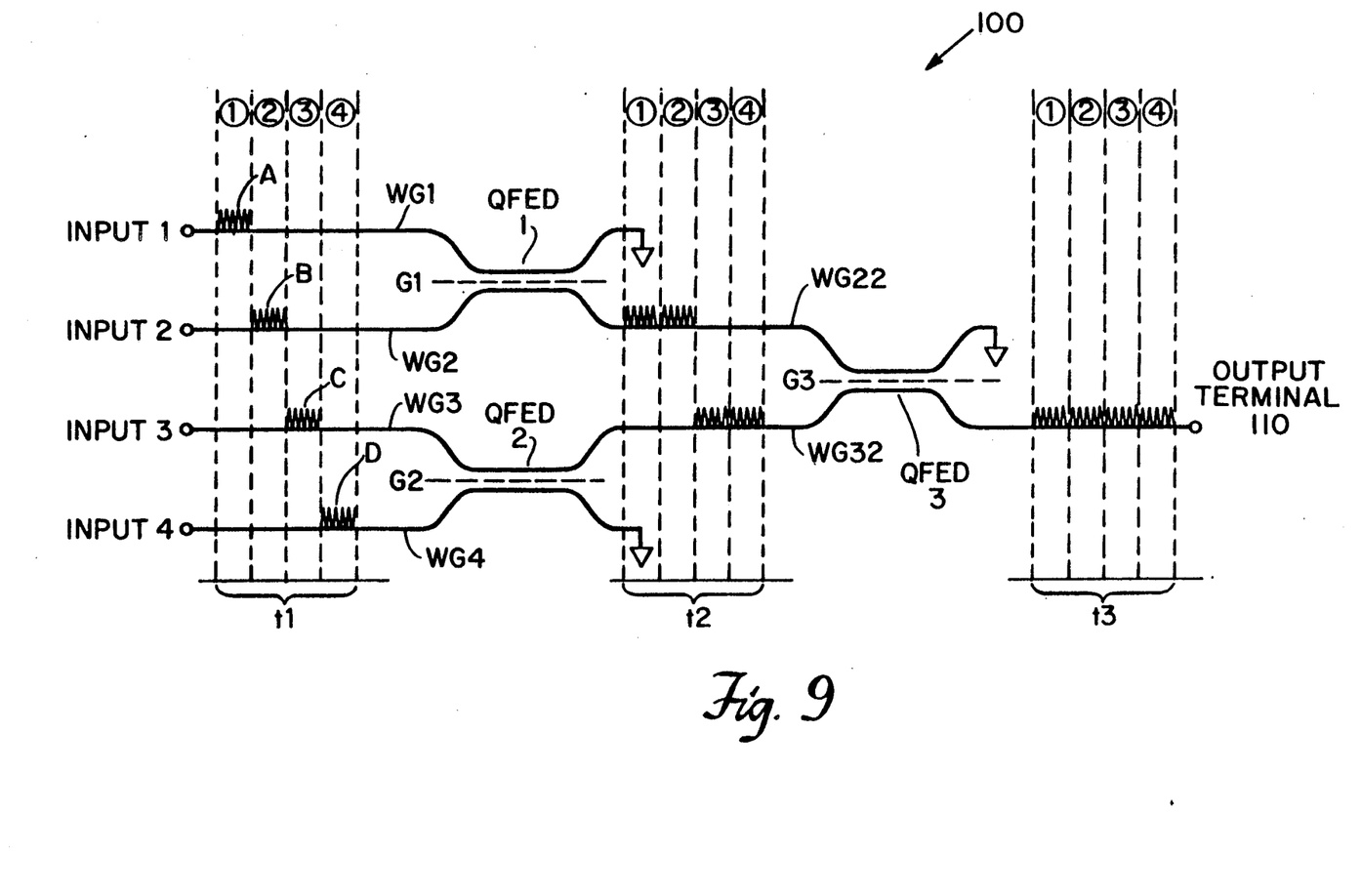
FIG. 9 is a schematic illustration of a plurality of QFED's connected to perform a multiplexing function.

The transfer length, $L_t$, as a function of barrier thickness and barrier height for a waveguide width $W_x$ of 500 Å, is shown in FIG. 7. $E_x = 2.2$ meV and $k_z = 8.4 \times 10^5$ cm$^{-1}$ are typical values for these dimensions. FIG. 9 indicates that as the barrier thickness (or the barrier height) increases, the coupling between the waveguides becomes weaker and the required $L_t$ increases very quickly. For adequate operation of the QFED, $L_t$ has to be smaller than the electron coherence length, $L_\phi$, which can be as high as 5 μm at sufficiently low temperatures. This imposes a limit to the strength of the barrier that can exist between the waveguides.

Figure 8:
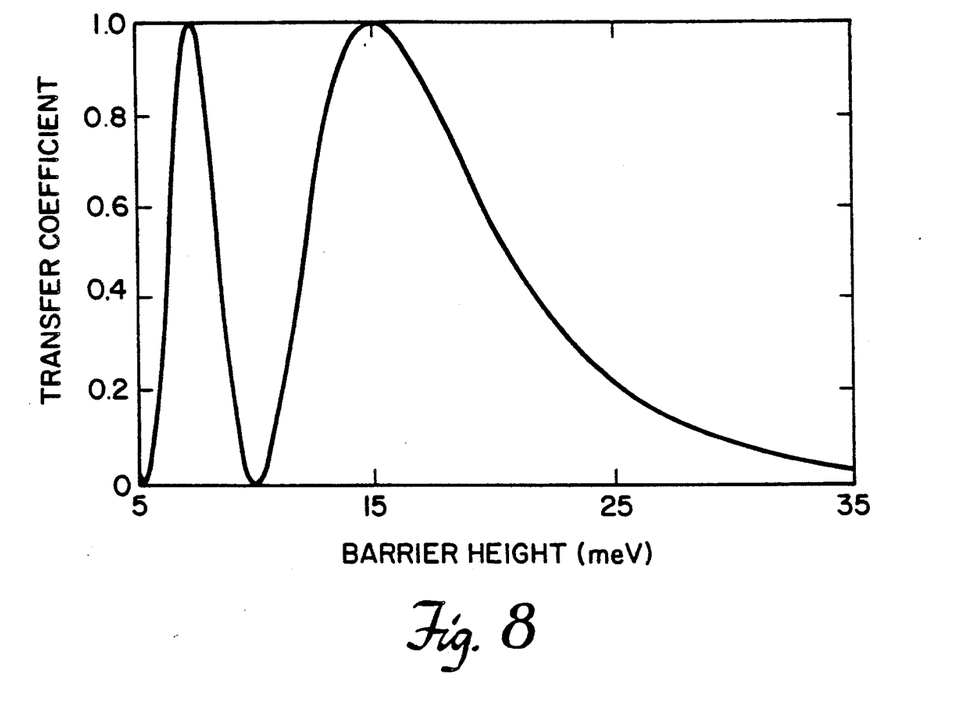
FIG. 8 is a plot of transfer coefficient versus barrier height in meV for a 5 $\mu$m long QFED with a 300 Å thick barrier.

FIG. 8 shows the transfer coefficient $T_c = |b(z=L_c)|^2 / |a(z=0)|^2$ as a function of barrier height for a 5 μm long QFED with 500 Å wide waveguides spaced 300 Å apart. These dimensions are within reach of modern lithography techniques. For large barrier heights, the required transfer length is much longer than the coupler length $L_t >> L_c$, and the transfer coefficient is negligible. As the barrier is reduced, $T_c$ increases exponentially. At about 15 meV, the transfer length precisely equals the QFED length and complete electron transfer is achieved. If the barrier is further reduced, $L_t < L_c$, the power transferred to the second waveguide decreases again. For about 10 meV, zero transfer is obtained since $L_t = L_c/2$. As the barrier is reduced, $T_c$ further oscillates between 0 and 1.

In the QFED 10, the barrier height, $V_B$, can be modified by the voltage $V_g$ applied to the gate resulting in control of $\kappa$ and $L_t$. The degree of electron transfer at the output of the drain waveguide can therefore be controlled by the voltage at the gate. At this voltage is changed, oscillations in the output current of the drain waveguide 18A can be observed precisely out of phase with the output current of the source waveguide 18B. The QFED behaves in this manner, as a multiple-valued voltage-controlled current switch. In analogy with guided-wave optics, the QFED may perform a number of electronic functions of potential interest for data processing, including multiplexing, demultiplexing, and electron filtering.

In the embodiments shown in FIG. 9, three QFED's labelled QFED 1, QFED 2 and QFED 3, are combined to form a multiplexer circuit wherein four separate input signals, shown as electron waveforms, at four separate input terminals labelled Input 1, 2, 3 and 4 are time-multiplexed and coupled to output terminal 110.

As shown in FIG. 9, QFED 1 is comprised of quantum waveguides WG 1 and WG 2 separated along a length $L_c$ by a very small width W over which a metallic gate G1 is disposed. QFED 2 is similarly comprised of quantum waveguides WG 3 and WG 4 and gate G2.

Four input signals A, B, C and D, spaced in respective time slots 1, 2, 3 and 4, are coupled to respective quantum waveguides WG 1, WG 2, WG 3 and WG 4 during time interval t1. Gates G1 and G2 are activated at a precise time, so as to couple all the electrons in WG 1 to WG2 and then inactivated so that no electrons are transferred to WG1 which is appropriately terminated to ground. In the same manner, the electrons in WG 4 are transferred to waveguide WG 3 at time slot 4 and retained in WG 3 at time slot 3.

Waveguides WG 2 and WG 3 extend to form WG 22 and WG 32 of QFED 3. By appropriate excitation of electrode G3 during time period t2, all the electrons in WG 22 are transferred to WG 32 which extends to output terminal 110 producing the time-multiplexed four signals during interval t3.

To time demultiplex four signals, the system of FIG. 9 is reversed, so that the output terminal 110 serves as the input terminal for demultiplexing, with the demultiplexed output occurring at input terminals 1-4.

In summary, the Quantum Field-Effect Directional Coupler (QFED) represents a new device in which coherent tunneling results in electron transfer between two coupled electron waveguides. The calculated device dimensions indicate that the directional coupling effect should be observed with device construction within range of modern nanolithography. For example, in an AlGaAs/GaAs system, if the two quantum waveguides are spaced 300 Å apart, an interaction length of about 1 μm is sufficient to allow complete switching. This dimension is smaller than the phase coherence length at 4.2K, which is about 5 μm.

EQUIVALENTS

The embodiment described herein is the presently preferred embodiment of the QFED. However, it is to be understood that various modifications thereof may be made by those skilled in the art without departing from the scope of the invention, as defined by the claims hereinafter set forth. For example, while the invention has been described in the context of an AlGaAs/GaAs system, other III-V constituents, such as InP/InGaAs, may be employed. Also InAs may be used as the channel layer 15 in combination with suitable confining materials, such as AlGaSb or SiO$_2$. Indeed, non-III-V semiconductor materials, such as Si/SiGe or ZnSe/GaAs, may also be be employed. Alternate epitaxy processes, such as, Molecular Beam Epitaxy (MBE) or Organometallic Vapor Phase Epitaxy (OMVPE), to produce the requisite modulation doped or superlattice quantum wire/waveguide structures, are contemplated.

Alternatively, a non-modulation doped quantum waveguide may be formed using appropriate metal contact regions to induce electric fields in SiO$_2$ isolated active Si regions.

We claim:

1. A voltage controlled switch for switching a quantity of electrons from one waveguide to another waveguide by quantum tunneling, comprising:
    a) two closely spaced electronic waveguides, wherein the movement of electrons in the waveguides is confined to one dimension, separated by a barrier height and a barrier thickness;
    b) a gate electrode adjacent said waveguides creating an electric field in said waveguides, thereby controlling the amount of quantum tunnelling between waveguides.

2. The switch of claim 1 wherein the electronic waveguides are formed in III-V material by providing two extended regions in which electron propagation is confined in two dimensions leaving propagation in only one direction along the length of the waveguide.

3. The switch of claim 1 wherein the probability of electrons switched between waveguides is controlled by the voltage $V_g$ applied to the gate electrode.

4. The switch of claim 1 wherein the waveguides are formed on an AlGaAs/GaAs modulation-doped heterostructure.

5. The switch of claim 3 wherein $V_g$ varies the energy barrier height between the two waveguides.

6. The switch of claim 1 wherein the waveguides are spaced apart by 500 Å or less.

7. A device for controlling coupling of electrons from one waveguide to another, comprising:
    a) a pair of waveguides extending a longitudinal length for a distance $L_c$ in close parallel proximity to each other and at each end of said distance extending away from each other each of said waveguides being dimensioned to confine propagation of electrons to one dimension;
    b) a gate electrode formed adjacent said waveguides and extending between the two waveguides along the close parallel longitudinal length thereof;
    c) a pair of containment electrodes adjacent said length of said waveguides and extending on opposite sides of said waveguides.

8. The device of claim 7 wherein the waveguides are formed in a modulation doped semiconductor layer formed on a substrate.

9. The device of claim 8 wherein the semiconductor layer is formed of a III-V compound.

10. The device of claim 8 wherein the semiconductor layer is formed of Si.

11. The device of claim 7 wherein the waveguides are formed in III-V material by providing two extended regions in which electron propagation is confined in two dimensions leaving propagation in only one direction along the length of the waveguide.

12. The device of claim 7 wherein the degree of electron probability density coupled between waveguides is controlled by the voltage $V_g$ applied to the gate electrode.

13. The device of claim 7 wherein the waveguides are formed on an AlGaAs/GaAs modulation-doped heterostructure.

14. The device of claim 12 wherein $V_g$ varies the energy barrier height between the two waveguides.

15. The device of claim 7 wherein the waveguides are spaced apart by 500 Å or less.

16. The device of claim 7 wherein the length of the waveguides along the close spacing $L_g$ is on the order of 1 μm.

* * * * *

UNITED STATES PATENT AND TRADEMARK OFFICE
CERTIFICATE OF CORRECTION

PATENT NO. : 5,105,232
DATED : Apr. 14, 1992
INVENTOR(S) : Jesus A. del Alamo and Cristopher C. Eugster It is certified that error appears in the above-identified patent and that said Letters Patent is hereby corrected as shown below:

Col. 8, line 39, delete "$L_g$" and insert ---$L_c$---.

Signed and Sealed this

Twenty-ninth Day of June, 1993

Attest:

MICHAEL K. KIRK

Attesting Officer

Acting Commissioner of Patents and Trademarks